(12) United States Patent
Li et al.

(10) Patent No.: US 9,748,968 B1
(45) Date of Patent: Aug. 29, 2017

(54) EXTREME INDEX FINDER AND FINDING METHOD THEREOF

(71) Applicant: National Tsing Hua University, Hsinchu (TW)

(72) Inventors: Mao-Ruei Li, Hsinchu (TW); Chia-Hsiang Yang, New Taipei (TW); Yeong-Luh Ueng, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 15/415,674

(22) Filed: Jan. 25, 2017

(30) Foreign Application Priority Data

Nov. 16, 2016 (TW) .............................. 105137528 A (51) Int. Cl.
H03M 1/82 (2006.01)
(52) U.S. Cl.
CPC ..................... *H03M 1/82* (2013.01)
(58) Field of Classification Search
CPC ...................................... H02M 1/82
USPC ........................................ 341/152
See application file for complete search history.

(56) References Cited

U.S. PATENT DOCUMENTS

| | | | |
|---|---|---|---|
| 7,970,230 B2 | 6/2011 | Kempf et al. | |
| 8,462,840 B2 * | 6/2013 | Chen | H03M 1/661 375/239 |
| 8,566,666 B2 | 10/2013 | Wang et al. | |
| 8,856,625 B2 | 10/2014 | Miyashita | |
| 9,054,925 B1 * | 6/2015 | Madoglio | H04L 27/20 |
| 9,577,684 B1 * | 2/2017 | Zur | H04B 1/0475 |

FOREIGN PATENT DOCUMENTS

| | | |
|---|---|---|
| CN | 101478313 | 7/2009 |
| CN | 104009762 | 8/2014 |
| TW | 223716 | 5/1994 |
| TW | I537817 | 6/2016 |

OTHER PUBLICATIONS

Chin-Long Wey et al, "Algorithms of Finding the First Two Minimum Values and Their Hardware Implementation", IEEE Transactions on Circuits and Systems—I: Regular Papers 55(11), Dec. 2008, pp. 3430-3437.
Daisuke Miyashita et al.,"An LDPC Decoder With Time-Domain Analog and Digital Mixed-Signal Processing", IEEE Journal of Solid-State Circuits 49(1), Jan. 2014, pp. 73-78.
(Continued)

*Primary Examiner* — Khai M Nguyen
(74) *Attorney, Agent, or Firm* — J. C. Patents (57) ABSTRACT

An extreme index finder and a digital value finding method are provided. The extreme index finder includes a plurality of digital-to-time converters (DTCs) and a first arbiter apparatus. The DTCs respectively receive a plurality of input signals and perform a digital-to-time converting operation on each of the input signals to respectively generate a plurality of time-domain signals. The first arbiter apparatus finds a position of a extreme value in the time-domain signals according to transition speeds of the time-domain signals and compares transition speed of the extreme value with each of the time-domain signals to find an extreme input signal corresponding to the extreme value in the input signals.

13 Claims, 4 Drawing Sheets

(56) References Cited

OTHER PUBLICATIONS

Mao-Ruei Li et al, "A 5.28-Gb/s LDPC Decoder With Time-Domain Signal Processing for IEEE 802.15.3c Applications", IEEE Journal of Solid-State Circuits PP(99), Dec. 2, 2016, pp. 1-13.
L. G. Amaru et al., "High Speed Architectures for Finding the First two Maximum/Minimum Values," IEEE Transactions on Very Large Scale Integration (VLSI) Systems, vol. 20, Issue 12, Dec. 2012.
Shirisha S et al., "Design and implementation of LDPC decoder using time domain-AMS processing," International Journal of Applied Research, 2015, pp. 271-276.
"Office Action of Taiwan Counterpart Application," dated Apr. 14, 2017, p. 1-p. 4.

\* cited by examiner

EXTREME INDEX FINDER AND FINDING METHOD THEREOF

CROSS-REFERENCE TO RELATED APPLICATION

This application claims the priority benefit of Taiwan application serial no. 105137528, filed on Nov. 16, 2016. The entirety of the above-mentioned patent application is hereby incorporated by reference herein and made a part of this specification.

BACKGROUND OF THE INVENTION

1. Field of the Invention

The invention relates to an extreme index finder and an extreme index finding method, and more particularly, to an extreme index finder and an extreme index finding method capable of finding minimum values in multiple input signals and which of the input signals corresponds to the minimum value.

2. Description of Related Art

In the field of digital communication, it is often required to find a minimum value and a second minimum value in multiple input signals. For example, the second minimum value needs to be determined when a min-sum algorithm is used in Low-density parity-check code (LDPC). In conventional technology, a compare tree algorithm is usually used to find the second minimum value. However, if a great number of the input signals is provided, not only will hardware architecture required in performing the compare tree algorithm become quite complex, a considerable number of circuit components is also required. As such, in addition to higher difficulty in design and rising on product price, a higher operation time is also required.

SUMMARY OF THE INVENTION

The invention is directed to an extreme index finder and an extreme index finding method, which are capable of finding extreme values included by multiple input signals and finding which one of the input signals is the first minimum or maximum.

The extreme index finder of the invention includes a plurality of digital-to-time converters and a first arbiter apparatus. The digital-to-time converters respectively receive a plurality of input signals and perform a digital-to-time converting operation on each of the input signals to respectively generate a plurality of time-domain signals. The first arbiter apparatus is coupled to the digital-to-time converters, finds a position of an extreme value in the time-domain signals according to transition speeds of the time-domain signals, and compares transition speed of the extreme value with each of the time-domain signals to find a minimum input signal corresponding to the extreme value in the input signals.

In an embodiment of the invention, the first arbiter apparatus includes a logical operator and a plurality of arbiters. The logical operator is coupled to the digital-to-time converters, receives the time-domain signals, and performs a logical operation on the time-domain signals to find the extreme value in the time-domain signals. The arbiters are coupled to the logical operator and respectively coupled to the digital-to-time converters. The arbiters compare transition speeds of the time-domain signals with the extreme value to generate a plurality of index values. The index values indicate whether the input signals are the extreme input signal.

In an embodiment of the invention, the logical operator performs an OR logical operation on the time-domain signals to generate the extreme value.

In an embodiment of the invention, each of the arbiters receives the minimum value and the corresponding time-domain signal, and generates a first index value according to transition time points of the extreme value and the corresponding time-domain signal.

In an embodiment of the invention, the first index value indicates that the corresponding input signal is not the extreme input signal when the transition time point of the extreme value is earlier than the transition time point of the corresponding time-domain signal, and the first index value indicates that the corresponding input signal is the extreme input signal when the transition time point of the extreme value is not earlier than the transition time point of the corresponding time-domain signal.

In an embodiment of the invention, the extreme index finder further includes at least one masking circuit and at least one second arbiter apparatus. The masking circuit receives the time-domain signals and the index values, and masks the time-domain signals according to the index values to generate a plurality of masked time-domain signals. The second arbiter apparatus is coupled to the at least one masking circuit, finds a second extreme value in the masked time-domain signals according to transition speeds of the masked time-domain signals, and compares transition speed of the masked time-domain signal corresponding to the second extreme value with each of the masked time-domain signals to find a second extreme input signal corresponding to the second extreme value in the input signals.

In an embodiment of the invention, the at least one masking circuit includes a plurality of logical gates. The logical gates respectively receive the time-domain signals and respectively receive the index values. Each of the logical gates determines whether to mask each of the time-domain signals to generate each of the masked time-domain signals according to each of the index values.

In an embodiment of the invention, the at least one second arbiter apparatus includes a logical operator and a plurality of arbiters. The logical operator receives the masked time-domain signals and performs a logical operation on the masked time-domain signals to find the second extreme value in the masked time-domain signals. The arbiters are coupled to the logical operator and respectively coupled to the masked digital-to-time converters. The arbiters respectively compare transition speeds of the masked time-domain signals with the extreme value to generate a plurality of index values. The index values indicate whether the input signals are the second extreme input signal.

The digital value finding method of the invention includes: receiving a plurality of input signals, and performing a digital-to-time operation on each of the input signals to generate a plurality of time-domain signals; finding an extreme value in the time-domain signals according to transition speeds of the time-domain signals; and comparing transition speed of the extreme value with each of the time-domain signals to find an extreme input signal corresponding to the extreme value in the input signals.

Based on the above, the invention applies the digital-to-time converters to convert multiple input signals into multiple time-domain signals and uses the arbiter apparatus to find the extreme value in the time-domain signals. Then, transition speed of the extreme value is compared with each of the time-domain signals to find an extreme input signal corresponding to the extreme value in the input signals. Accordingly, the invention can complete the operation of finding the extreme input signal in the input signals using simple circuit scheme. Moreover, according to the embodiments of the invention, multiple sets of masking circuit and arbiter apparatus in serial connection may be further used to find a plurality of second extreme values of the input signals or even arrange the input signals in ascending order.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
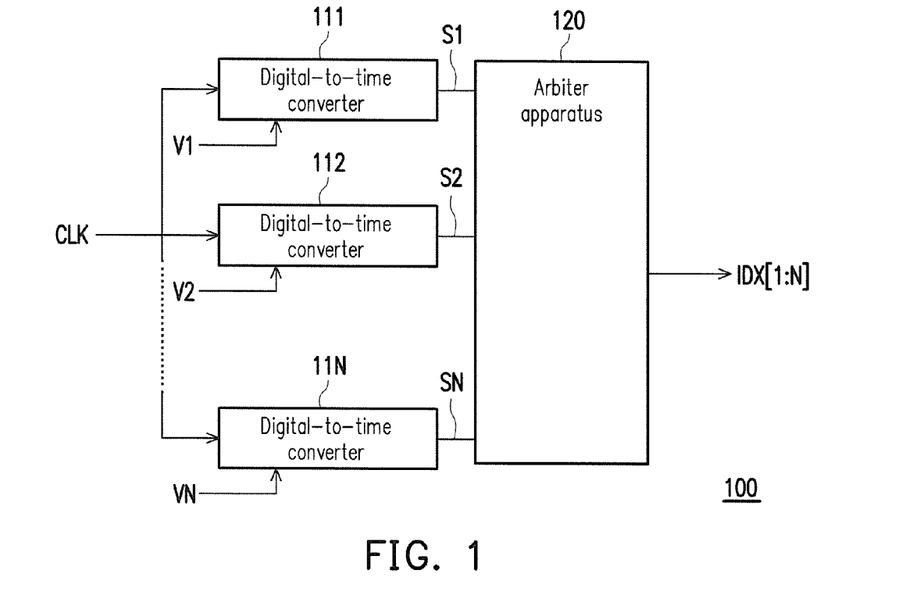
FIG. 1 illustrates a schematic diagram of an extreme index finder according to an embodiment of the invention.

Referring to FIG. 1, FIG. 1 illustrates a schematic diagram of an extreme index finder according to an embodiment of the invention. The extreme index finder 100 includes digital-to-time converters 111 to 11N and an arbiter apparatus 120. The digital-to-time converters 111 to 11N respectively receive a plurality of input signals V1 to VN and perform a digital-to-time converting operation on each of the input signals V1 to VN to respectively generate a plurality of time-domain signals S1 to SN. The digital-to-time converters 111 to 11N commonly receive a clock signal CLK, and perform the digital-to-time converting operation on each of the input signals V1 to VN to respectively generate the time-domain signals S1 to SN according to the clock signal CLK.

Figure 2:
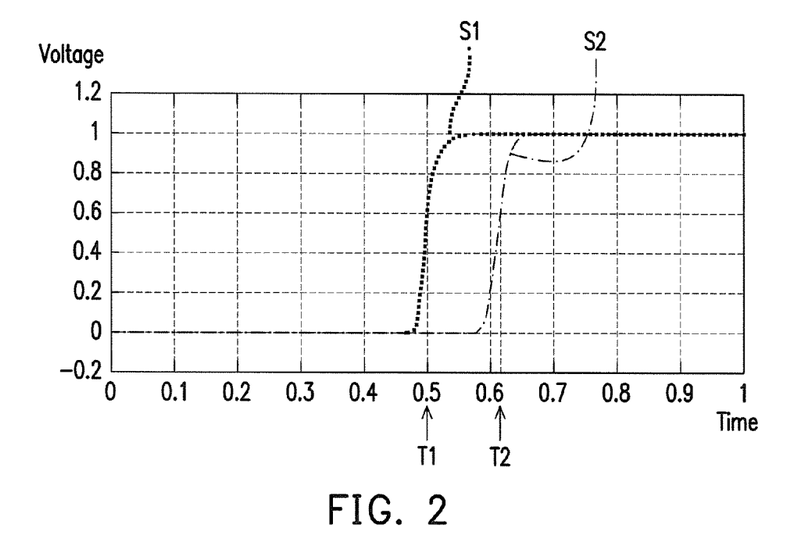
FIG. 2 illustrates a schematic diagram of a time-domain signal according to an embodiment of the invention of the arbiter.

Herein, each of the input signals V1 to VN is a digital signal having multiple bits. The digital-to-time converters 111 to 11N respectively generate the time-domain signals S1 to SN according to values of the input signals V1 to VN. Further description is provided below with reference to the schematic diagram of the time-domain signal according to the embodiment of the invention illustrated in FIG. 2. In FIG. 2, the time-domain signal S1 is generated for the digital-to-time converting operation on the input signal V1, and the time-domain signal S2 is generated for the digital-to-time converting operation on the input signal V2. In an example where each of the input signals V1 and V2 is a digital signal having four bits, the four bits of the input signal V1 may be 0, 1, 1 and 0 and the four bits of the input signal V2 may be 1, 0, 1 and 1. In other words, the value of the input signal V1 is 6 and the value of the input signal V2 is 11. Therefore, the time-domain signal S1 generated for the digital-to-time converting operation on the input signal V1 is transited from low-voltage signal to high-voltage signal at a time point T1, and the time-domain signal S2 generated for the digital-to-time converting operation on the input signal V2 is transited from low-voltage signal to high-voltage signal at a time point T2, where the time point T1 is earlier than the time point T2.

Naturally, the input signal having four bits in the above example is merely a descriptive example. The input signal may have any number of multiple bits without any particular limitations in the embodiments of the invention.

In view of the above description, the digital-to-time converting operation performed by the digital-to-time converters 111 to 11N can allow the time-domain signal generated corresponding to the input signal having smaller value to include faster transition speed and allow the time-domain signal generated corresponding to the input signal having greater value to include slower transition speed.

Referring back to FIG. 1, the arbiter apparatus 120 is coupled to the digital-to-time converters 111 to 11N to receive the time-domain signals S1 to SN. The arbiter apparatus 120 compares transition speeds of the time-domain signals S1 to SN and finds a minimum value (an extreme value), which is the first one being transited among the time-domain signals S1 to SN. Specifically, the arbiter apparatus 120 can perform a logical operation on the time-domain signals S1 to SN to find the minimum value. For example, the arbiter apparatus 120 can perform an OR logical operation on the time-domain signals S1 to SN to find the minimum value.

Taking a waveform diagram in FIG. 2 for example, when the OR logical operation is performed on the time-domain signals S1 to SN, the generated operation result is equal to the time-domain signal corresponding to the input signal having the minimum value. For example, the operation result generated by performing the OR logical operation on the time-domain signals S1 and S2 is equal to the time-domain signal S1 corresponding to the input signal V1 having smaller value (=6) so the minimum value may then be obtained. Further, other than finding the minimum value in the time-domain signals S1 to SN, the arbiter apparatus 120 can further compare transition speed of the minimum value with each of the time-domain signals S1 to SN to find out which one of the input signals V1 to VN is a minimum input signal (an extreme input signal) corresponding to the minimum value. Herein, the arbiter apparatus 120 performs a comparison on transition speeds between the minimum value and each of the time-domain signals S1 to SN and generates a plurality of index values IDX[1:N] according to the comparison result. Each of the index values IDX[1:N] respectively indicate whether the corresponding input signals V1 to VN are the minimum input signal. Specifically, in the comparison on transition speeds between the minimum value and each of the time-domain signals S1 to SN performed by the arbiter apparatus 120, when transition speed of the minimum value is faster than transition speed of one time-domain signal (e.g., the time-domain signal S1), it indicates that the input signal V1 corresponding to the time-domain signal S is not the minimum input signal so the arbiter apparatus 120 can generate the index value IDX[1] equal to a first logical level. Conversely, when transition speed of the minimum value is not faster than transition speed of one time-domain signal (e.g., the time-domain signal S2), it indicates that the input signal V2 corresponding to the time-domain signal S2 is the minimum input signal so the arbiter apparatus 120 can generate the index value IDX[1] equal to a second logical level different from the first logical level.

In view of the above description, the minimum value in the input signals V1 to VN may be determined by performing an inverse operation of the digital-to-time converting operation on the minimum value generated by the arbiter apparatus 120. In addition, which one of the input signals V1 to VN is the minimum input signal may be determined according to the index values IDX[1:N].

Incidentally, the number of the digital-to-time converters 111 to 11N may be two or more in the embodiments of the invention, such number is not particularly limited. Implementation detail of the digital-to-time converters 111 to 11N may be realized by using any digital-to-time converting circuits in existing technology without particular limitations. A resolution of the time-domain signals S1 to SN may be controlled by a frequency of the clock signal CLK received by the digital-to-time converters 111 to 11N. Herein, the frequency of the clock signal CLK may be proportional to the resolution of the time-domain signals S1 to SN.

Please be noted here, in some embodiment, if the time-domain signals S1 to SN in FIG. 2 are inverted, a maximum value can be found. Accordingly, a maximum input signal can be found.

Figure 3:
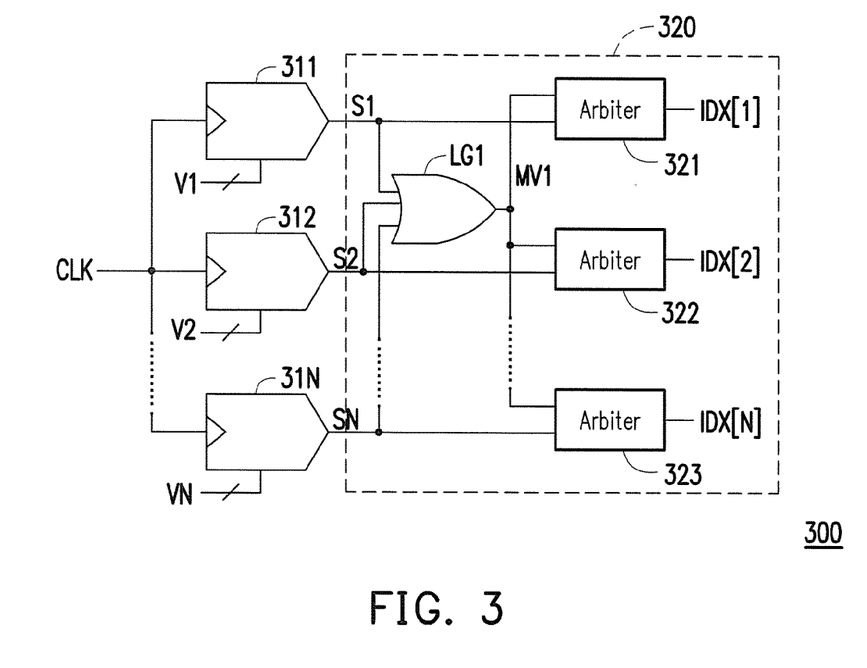
FIG. 3 illustrates a schematic diagram of an extreme index finder according to another embodiment of the invention.

Next, referring to FIG. 3, FIG. 3 illustrates a schematic diagram of an extreme index finder according to another embodiment of the invention. The extreme index finder 300 includes digital-to-time converters 311 to 31N and an arbiter apparatus 320. The arbiter apparatus 320 includes arbiters 321 to 32N and a logical operator LG1. The digital-to-time converters 311 to 31N respectively receive input signals V1 to VN and perform a digital-to-time converting operation on the input signals V1 to VN to generate time-domain signals S1 to SN. Herein, transition speeds of the time-domain signals S1 to SN are different based on values of the input signals V1 to VN, and transition speeds of the time-domain signals S1 to SN are slower (faster) when the values of the input signals V1 to VN are greater (smaller).

The logical operator LG1 receives the time-domain signals S1 to SN and performs a logical OR operation on the time-domain signals S1 to SN to thereby generate a minimum value MV1. Herein, the minimum value MV1 represents the first one being transited among the time-domain signals S1 to SN. As such, the minimum value in the input signals V1 to VN may be obtained by performing an inverse operation of the digital-to-time converting operation (i.e., a time-to-digital converting operation) on the minimum value MV1.

The arbiters 321 to 32N commonly receive the minimum value MV1 and respectively receive the time-domain signals S1 to SN. Each of the arbiters 321 to 32N can recognize which one of the time-domain signals S1 to SN is substantially equal to the minimum value MV1 by comparing transition time point of the minimum value MV1 with each of the time-domain signals S to SN. Accordingly, which one of the input signals V1 to VN is the minimum input signal having the minimum value may be determined according to the index values IDX[1:N] generated by the arbiters 321 to 32N.

Figure 4:
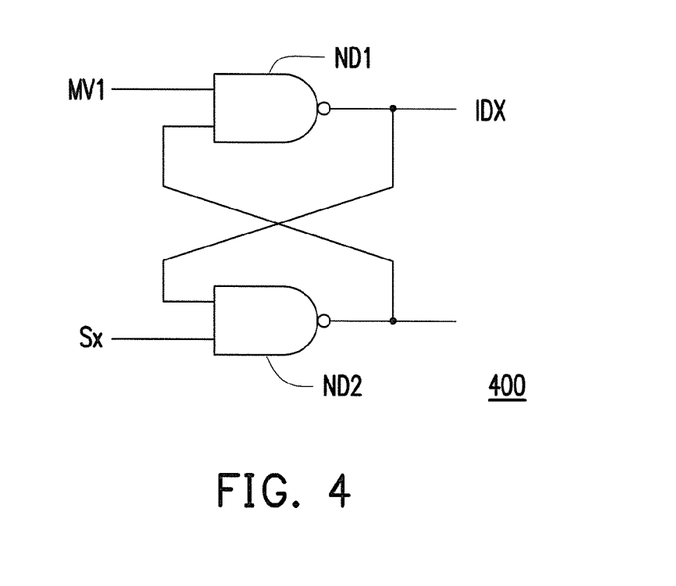
FIG. 4 illustrates an implementation of an arbiter according to an embodiment of the invention.

Referring to FIG. 4, FIG. 4 illustrates an arbiter according to an embodiment of the invention. In the present embodiment, an arbiter 400 includes NAND gates ND1 and ND2. The NAND gate ND1 has one input terminal receiving the minimum value MV1 and another input terminal coupled to an output terminal of the NAND gate ND2. The NAND gate ND2 has one input terminal receiving a time-domain signal Sx and another input terminal coupled to an output terminal of the NAND gate ND1. The output terminal of the NAND gate ND1 can generate an index value IDX.

Figure 5:
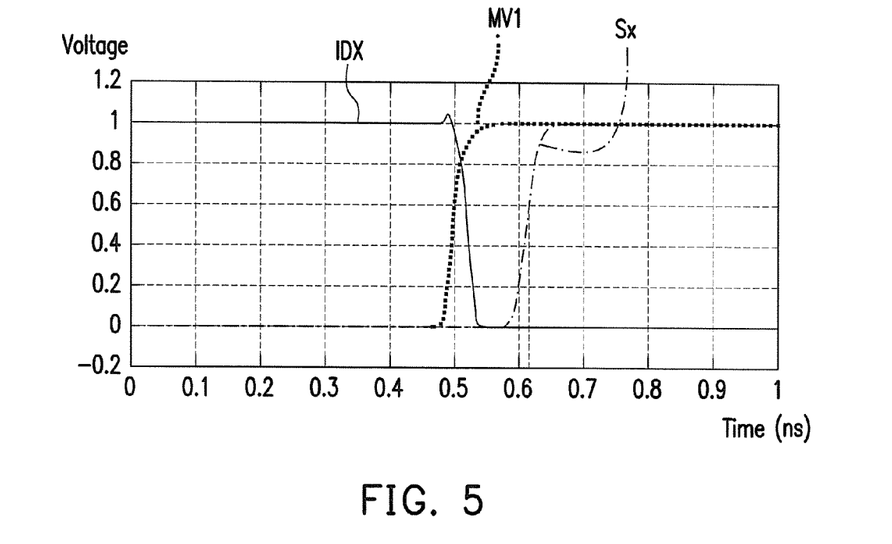
FIG. 5 illustrates a waveform diagram of operations of the arbiter according to an embodiment of the invention.

Detailed operation regarding the arbiter 400 can refer to FIG. 4 and FIG. 5 together. FIG. 5 illustrates a waveform diagram of operations of the arbiter according to an embodiment of the invention. In FIG. 5, the minimum value MV1 is transited close to 0.5 ns (nanosecond) and the time-domain signal Sx is transited at 0.8 ns. Before the minimum value MV1 and the time-domain signal Sx are both transited to high-voltage level, the index value IDX generated by the arbiter 400 maintains at logical high level. Because a transition time point of the minimum value MV1 is earlier than a transition time point of the time-domain signal Sx, in correspondence to transition behavior of the minimum value MV1, the index value IDX generated by the arbiter 400 is transited from logical high level to logical low level.

On the other hand, if the transition time point of the minimum value MV1 is not earlier than the transition time point of the time-domain signal Sx, the index value IDX generated by the arbiter 400 maintains at logical high level without being effectively transited to logical low level.

In view of the above description, logical level of the index value IDX generated by the arbiter 400 may be used to determine whether the time-domain signal Sx is equal to the minimum value MV1 and determine whether an input signal corresponding to the time-domain signal Sx is a minimum input signal.

It should be noted that, the arbiter 400 composed of the NAND gates ND1 and ND2 is merely one implementation in the embodiments of the invention. Persons skilled in art would understand that the same logical operation may be designed by using various different logical circuit schemes. Therefore, the embodiment of FIG. 5 of the invention is merely an exemplary example rather than limitation to the scope of the invention.

Figure 6:
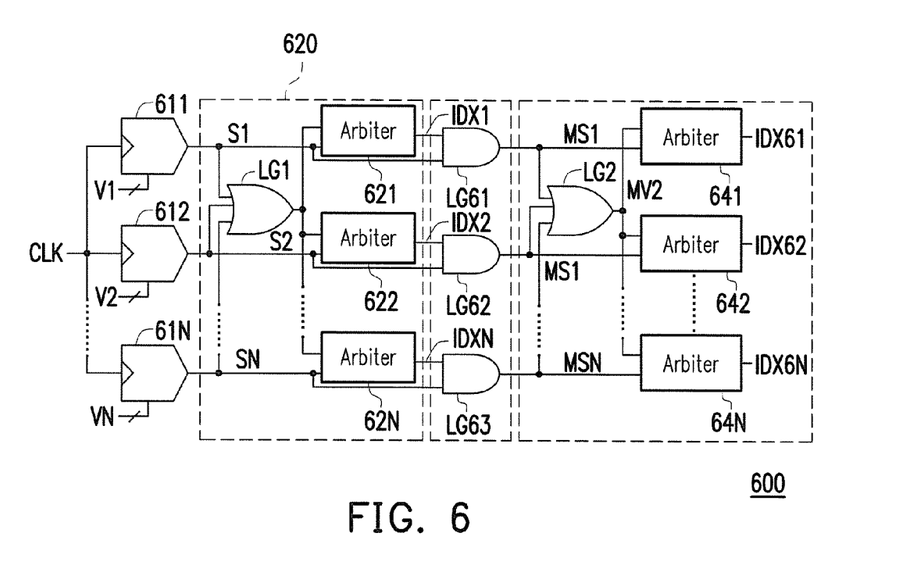
FIG. 6 illustrates a schematic diagram of an extreme index finder according to yet another embodiment of the invention.

Next, referring to FIG. 6, FIG. 6 illustrates a schematic diagram of an extreme index finder according to yet another embodiment of the invention. The extreme index finder 600 includes digital-to-time converters 611 to 61N, an arbiter apparatus 620, a masking circuit 630 and an arbiter apparatus 640. The arbiter apparatus 620 includes a logical operator LG1 and arbiters 621 to 62N. The masking circuit 630 includes a plurality of logical gates LG61 to LG6N. The arbiter apparatus 640 includes a logical operator LG2 and arbiters 641 to 64N.

Unlike the foregoing embodiments, the masking circuit 630 and the arbiter apparatus 640 are further disposed and coupled to the arbiter apparatus 620 in the present embodiment. Herein, the masking circuit 630 receives index values IDX1 to IDXN, and masks one of the time-domain signals S1 to SN corresponding to the minimum input signal to generate masked time-domain signals MS1 to MSN.

The masked time-domain signals MS1 to MSN are transmitted to the logical operator LG2 in the arbiter apparatus 640. Herein, because one of the time-domain signals S to SN corresponding to the minimum input signal is masked, the logical operator LG2 can generate a second minimum value MV2 according to the masked time-domain signals MS1 to MSN. In other words, a second minimum value in the input signals V1 to VN may be determined through the second minimum value MV2.

Further, the arbiters 641 to 64N can respectively generate index values IDX61 to IDX6N by comparing the transition time points of the masked time-domain signals MS1 to MSN with the second minimum value MV2. Which one of the input signals V1 to VN is the second minimum input signal may be determined according to logical level of each of the index values IDX61 to IDX6N.

In view of the above description, it is not difficult to understand that, the extreme index finder of the invention may be designed using simple circuit scheme, and the circuit cost may be effectively reduce since the circuit complexity is not significantly increased when increasing number of input signals are used. In addition, because all the input signals are processed in a parallel manner, the increasing number of the input signals will not cause increment on process time so performance of the extreme index finder may be effectively improved.

Figure 7:
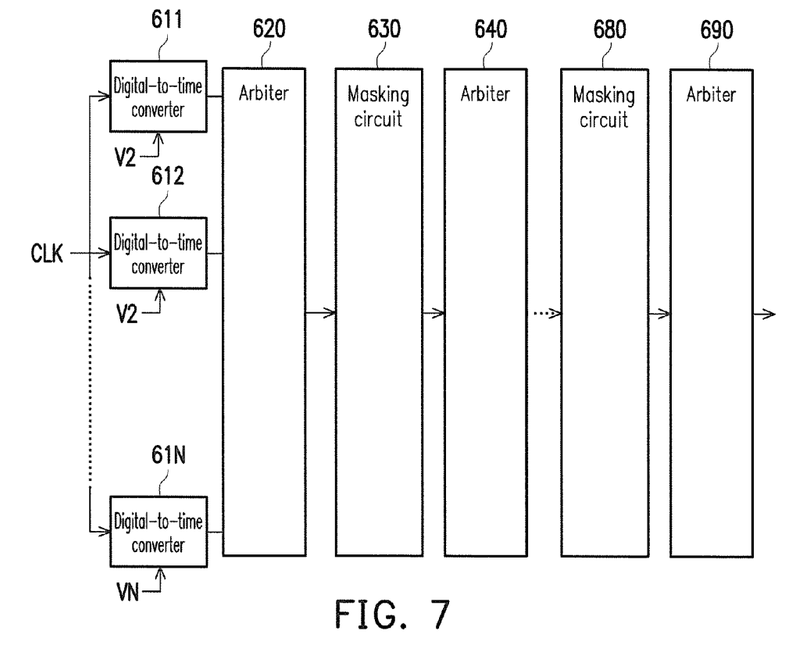
FIG. 7 illustrates an extended implementation of FIG. 6 according to an embodiment of the invention.

Referring to FIG. 7, FIG. 7 illustrates an extended implementation of FIG. 6 according to an embodiment of the invention. In FIG. 7, in addition to the digital-to-time converters 611 to 61N, the arbiter apparatus 620, the masking circuit 630 and the arbiter apparatus 640, the extreme index finder further includes one or more sets of a masking circuit 680 and an arbiter apparatus 690 in serial connection. Second minimum value, third minimum value and so forth in the input signals V1 to VN may then be sequentially found with multiple sets of the masking circuits 630 and 680 and the arbiter apparatuses 640 and 690 in serial connection. The input signals V1 to VN may be found and arranged in ascending order if sufficient numbers the masking circuits 630 and 680 and the arbiter apparatuses 640 and 690 are provided.

Figure 8:
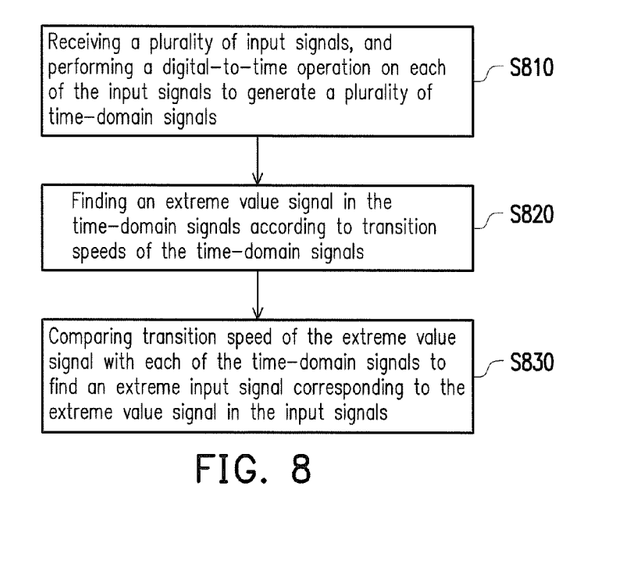
FIG. 8 illustrates a flowchart of an extreme index finding method according to an embodiment of the invention.

Referring to FIG. 8, FIG. 8 is a schematic flowchart illustrating an extreme index finding method according to an embodiment of the invention. In step S810, a plurality of input signals are received, and a digital-to-time converting operation is performed on each of the input signals to generate a plurality of time-domain signals. In step S820, an extreme value in the time-domain signals is found according to transition speeds of the time-domain signals. Then, in step S830, transition speed of the extreme value is compared with each of the time-domain signals to find a extreme input signal corresponding to the extreme value in the input signals.

Relevant implementation detail for the steps above has been described in the foregoing embodiments and implementations, which is not repeated hereinafter.

In summary, the invention provides the arbiter apparatus to find the extreme value in the time-domain signals according to transition speeds of the time-domain signals and to find the extreme input signal corresponding to the extreme value by comparing transition speed of the extreme value with the each of the time-domain signals. Accordingly, the operation of finding the extreme input signal and the extreme value may be completed using simple circuit scheme. Moreover, according to the embodiments of the invention, performance of the extreme index finder may be further improved by finding one or more second extreme values and second extreme input signals by using the masking circuits and the arbiter apparatuses.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An extreme index finder, comprising:
   a plurality of digital-to-time converters, respectively receiving a plurality of input signals, and performing a digital-to-time converting operation on the input signals to respectively generate a plurality of time-domain signals; and
   a first arbiter apparatus, coupled to the digital-to-time converters, finding an extreme value in the time-domain signals according to transition speeds of the time-domain signals, and comparing transition speed of the extreme value with each of the time-domain signals to find an extreme input signal corresponding to the extreme value in the input signals,
   wherein, the extreme value is a maximum value or a minimum value.

2. The extreme index finder according to claim 1, wherein the first arbiter apparatus comprises:
   a logical operator, coupled to the digital-to-time converters, receiving the time-domain signals, and performing a logical operation on the time-domain signals to find the extreme value in the time-domain signals; and
   a plurality of arbiters, coupled to the logical operator and respectively coupled to the digital-to-time converters, the arbiters respectively comparing transition speeds of the time signals with the extreme value to generate a plurality of index values, wherein the index values indicate whether the input signals are the extreme input signal.

3. The extreme index finder according to claim 2, wherein the logical operator performs an OR logical operation on the time-domain signals to generate the extreme value.

4. The extreme index finder according to claim 2, wherein each of the arbiters receives the extreme value and the corresponding time-domain signal, and generates a first index value according to transition time points of the extreme value and the corresponding time-domain signal.

5. The extreme index finder according to claim 4, wherein the first index value indicates that the corresponding input signal is not the extreme input signal when the transition time point of the extreme value is earlier than the transition time point of the corresponding time-domain signal, and the first index value indicates that the corresponding input signal is the extreme input signal when the transition time point of the extreme value is not earlier than the transition time point of the corresponding time-domain signal.

6. The extreme index finder according to claim 1, further comprising:
   at least one masking circuit, receiving the time-domain signals and the index values, and masking the time-domain signals according to the index values to generate a plurality of masked time-domain signals; and
   at least one second arbiter apparatus, coupled to the at least one masking circuit, finding a second extreme value in the masked time-domain signals according to transition speeds of the masked time-domain signals, and comparing transition speed of the masked time-domain signal corresponding to the second extreme value with each of the masked time-domain signals to find a second extreme input signal corresponding to the second extreme value in the input signals.

7. The extreme index finder according to claim 6, wherein the at least one masking circuit comprises:
   a plurality of logical gates, respectively receiving the time-domain signals and respectively receiving the index values, each of the logical gates determining whether to mask each of the time-domain signals to generate each of the masked time-domain signals according to each of the index values.

8. The extreme index finder according to claim 6, wherein the at least one second arbiter apparatus comprises:
   a logical operator, receiving the masked time-domain signals and performing a logical operation on the masked time-domain signals to find the second extreme value in the masked time-domain signals; and
   a plurality of arbiters, coupled to the logical operator and respectively coupled to the masked digital-to-time converters, the arbiters respectively comparing transition speeds of the masked time-domain signals with the extreme value to generate a plurality of index values,
   wherein the index values indicate whether the input signals are the second extreme input signal.

9. An extreme index finding method, comprising:
   receiving a plurality of input signals, and performing a digital-to-time operation on each of the input signals to generate a plurality of time-domain signals;
   finding a extreme value in the time-domain signals according to transition speeds of the time-domain signals; and
   comparing transition speed of the extreme value with each of the time-domain signals to find an extreme input signal corresponding to the extreme value in the input signals,
   wherein the extreme value is a maximum value or a minimum value.

10. The extreme index finding method according to claim 9, wherein the step of finding the extreme value in the time-domain signals according to transition speeds of the time-domain signals comprises:
   performing an OR logical operation on the time-domain signals to generate the extreme value.

11. The extreme index finding method according to claim 9, wherein the step of comparing transition speeds of the extreme value with each of the time-domain signals to find the extreme input signal corresponding to the extreme value in the input signals comprises:
   comparing transition speeds of the time-domain signals with the extreme value to generate a plurality of index values, wherein the index values indicate whether the input signals are the extreme input signal.

12. The extreme index finding method according to claim 11, wherein the corresponding index value of each of the time-domain signal indicates that the corresponding input signal is not the extreme input signal when a transition time point of the extreme value is earlier than a transition time point of each of time-domain signals, and the corresponding index value indicates the corresponding input signal is the extreme input signal when the transition time point of the extreme value is not earlier than the transition time point of each of time-domain signals.

13. The extreme index finding method according to claim 9, further comprising:
   masking the time-domain signals according to the index values to generate a plurality of masked time-domain signals;
   finding a second extreme value in the masked time-domain signals according to transition speeds of the masked time-domain signals; and
   comparing transition speed of the masked time-domain signal corresponding to the second extreme value with each of the masked time-domain signals to find a second extreme input signal corresponding to the second extreme value in the input signals.

* * * * *